(12) United States Patent
Bruce et al.

(10) Patent No.: US 8,499,260 B2
(45) Date of Patent: Jul. 30, 2013

(54) OPTICAL PROXIMITY CORRECTION VERIFICATION ACCOUNTING FOR MASK DEVIATIONS

(75) Inventors: James A. Bruce, Williston, VT (US); Kenneth T. Settlemyer, Jr., Bradenton, FL (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 13/014,159

(22) Filed: Jan. 26, 2011

(65) Prior Publication Data

US 2012/0192124 A1 Jul. 26, 2012

(51) Int. Cl.
*G06F 17/50* (2006.01)

(52) U.S. Cl.
USPC .............. 716/54; 716/50; 716/51; 716/52; 716/53

(58) Field of Classification Search
USPC ........................................ 716/50–54
See application file for complete search history.

(56) References Cited

U.S. PATENT DOCUMENTS

| | | | | |
|---|---|---|---|---|
| 5,800,951 A * | 9/1998 | Hashimoto | | 430/5 |
| 6,067,375 A | 5/2000 | Tsudaka | | |
| 6,106,980 A * | 8/2000 | Pierrat et al. | | 430/5 |
| 6,187,687 B1 | 2/2001 | Plat et al. | | |
| 6,415,421 B2 | 7/2002 | Anderson et al. | | |
| 6,606,533 B1 * | 8/2003 | Whiting | | 700/121 |
| 6,665,856 B1 | 12/2003 | Pierrat et al. | | |
| 6,766,507 B2 * | 7/2004 | Bruce et al. | | 716/51 |
| 6,952,818 B2 | 10/2005 | Ikeuchi | | |
| 7,065,738 B1 | 6/2006 | Kim | | |
| 7,093,229 B2 | 8/2006 | Pang et al. | | |
| 7,114,145 B2 | 9/2006 | Ye et al. | | |
| 7,233,887 B2 | 6/2007 | Smith | | |
| 7,245,356 B2 * | 7/2007 | Hansen | | 355/67 |
| 7,264,906 B2 | 9/2007 | Croffie et al. | | |
| 7,281,222 B1 | 10/2007 | Babcock | | |
| 7,318,214 B1 | 1/2008 | Prasad et al. | | |
| 7,325,222 B2 | 1/2008 | Strelkova et al. | | |

(Continued)

FOREIGN PATENT DOCUMENTS

JP 2009139632 A 6/2009

OTHER PUBLICATIONS

Rodrigues, et al., "Optical Lithography Simulation with Focus Variation using Wavelet Transform", IEEE 2010.

(Continued)

*Primary Examiner* — Sun Lin
(74) *Attorney, Agent, or Firm* — Katherine S. Brown; Hoffman Warnick LLC (57) ABSTRACT

Solutions for accounting for photomask deviations in a lithographic process during optical proximity correction verification are disclosed. In one embodiment, a method includes: identifying a wafer control structure in a data set representing one of a first chip or a kerf; biasing the data set representing the first chip in the case that the wafer control structure is in the data set representing the first chip; biasing the data set representing the kerf or a second chip distinct from the first chip, in the case that the wafer control structure is in the data set representing the kerf or the second chip; simulating formation of the wafer control structure; determining whether the simulated wafer control structure complies with a target control structure; and iteratively adjusting an exposure dose condition in the case that the simulated wafer control structure does not comply with the target control structure.

20 Claims, 8 Drawing Sheets

U.S. PATENT DOCUMENTS

| | | | |
|---|---|---|---|
| 7,350,183 | B2 | 3/2008 | Cui et al. |
| 7,383,530 | B2 | 6/2008 | Wang et al. |
| 7,480,890 | B2 | 1/2009 | Hsiao |
| 7,587,704 | B2 | 9/2009 | Ye et al. |
| 7,617,477 | B2 | 11/2009 | Ye et al. |
| 7,624,369 | B2 | 11/2009 | Graur et al. |
| 7,646,906 | B2 | 1/2010 | Saidin et al. |
| 7,689,966 | B2 | 3/2010 | Verma et al. |
| 7,694,267 | B1 | 4/2010 | Ye et al. |
| 7,695,876 | B2 | 4/2010 | Ye et al. |
| 7,752,595 | B2 | 7/2010 | Maeda et al. |
| 7,805,699 | B2 | 9/2010 | Kusnadi et al. |
| 8,014,991 | B2 | 9/2011 | Mitrovic et al. |
| 8,057,967 | B2 * | 11/2011 | Ye et al. .............................. 430/5 |
| 8,200,468 | B2 | 6/2012 | Ye et al. |
| 2003/0219154 | A1 | 11/2003 | Medvedeva et al. |
| 2004/0268291 | A1 | 12/2004 | Alvarez-Gomariz et al. |
| 2005/0055658 | A1 | 3/2005 | Mukherjee et al. |
| 2007/0031745 | A1 | 2/2007 | Ye et al. |
| 2007/0113216 | A1 | 5/2007 | Zhang |
| 2007/0292778 | A1 | 12/2007 | Bang et al. |
| 2008/0204690 | A1 | 8/2008 | Berger et al. |
| 2009/0031262 | A1 | 1/2009 | Maeda et al. |
| 2009/0132992 | A1 | 5/2009 | Zhou et al. |
| 2009/0157360 | A1 | 6/2009 | Ye et al. |
| 2009/0265680 | A1 | 10/2009 | Izuha et al. |
| 2010/0122225 | A1 | 5/2010 | Cao et al. |
| 2010/0162197 | A1 | 6/2010 | Ye et al. |
| 2010/0175042 | A1 | 7/2010 | Tirapu Azpiroz et al. |
| 2010/0180251 | A1 | 7/2010 | Ye et al. |
| 2012/0191234 | A1 * | 7/2012 | Bruce et al. .................. 700/103 |

OTHER PUBLICATIONS

Sturtevant et al., "Novel Method for Optimizing Lithography Exposure Conditions using Full-Chip Post-OPC Simulation", Optical Microlithography XXI, 2008.

Jank et al., "Method for fast and accurate calibration of litho simulator for hot spot analysis", PE-82.

Anderson et al., "Optimizing process window robustness with reconfigurable OPC (reconfigurable optical proximity correction)", Solid State Technology 2006.

Ban et al., "A Fast Lithography Verification Framework for Litho-Friendly Layout Design", Proceedings of the Sixth International Symposium on Quality Electronic Design, 2005.

Word et al., "Lithography yield enhancement through optical rule checking", Advanced Microlithography Technologies, 2005.

Hung et al., "Post-OPC verification using a full-chip Pattern-Based simulation verification method", 25th Annual BACUS Symposium on Photomask Technology, 2005.

Lucas, et al., Patterning control budgets for the 32nm generation incorporating lithography, design, and RET variations, Optical Microlithography XX, Proc. of SPIE, vol. 6520, 65200N, 2007.

Zach et al., "Process dependencies of Optical Proximity Corrections", Optical Microlithography XIV, Proceedings of SPIE vol. 4346, 2001.

U.S. Appl. No. 12/953,511, Office Action dated Mar. 1, 2013.

U.S. Appl. No. 13/014,152, Office Action dated Mar. 12, 2013.

* cited by examiner

OPTICAL PROXIMITY CORRECTION VERIFICATION ACCOUNTING FOR MASK DEVIATIONS

CROSS-REFERENCE TO RELATED APPLICATIONS

The current application is related in some aspects to U.S. patent application Ser. No. 13/014,152, filed on Jan. 26, 2011, which is hereby incorporated by reference.

BACKGROUND OF THE INVENTION

The subject matter disclosed herein relates to accounting for deviations in masks (photomasks) used in the fabrication of integrated circuits. More specifically, the subject matter disclosed herein relates to accounting for deviations in photomasks and including the effects of these deviations in optical proximity correction verification (OPCV) simulations.

In the case that an integrated circuit process mask (e.g., a photomask) is not printed at its target critical dimension (CD), or the structure used for controlling the wafer lithography line is not at its target dimension on the mask, the lithography process may compensate for these errors by adjusting the exposure dose used. However, where the effect of changing dose is not equivalent to the change in mask critical dimensions for all structures, optical proximity correction verification (OPCV) may be inaccurate. For example, if a control structure is 2 nanometers larger than target on a mask, and the dose is reduced in order to make the control structure print at its target, then other structures may be printed at altered dimensions (e.g., either larger or smaller), depending upon the mask error enhancement factors (MEEF) and the exposure latitude of those structures.

Prior approaches assume that changing the exposure dose in-line will compensate exactly for changes in the mask critical dimension. However, when this assumption is invalid, OPCV may not account for these errors that could cause yield and reliability issues in the underlying printed circuit.

BRIEF SUMMARY OF THE INVENTION

Solutions for accounting for photomask deviations in a lithographic process during optical proximity correction verification are disclosed. In one embodiment, a method includes: identifying a wafer control structure in a data set representing one of a first chip or a kerf; biasing the data set representing the chip first in the case that the wafer control structure is in the data set representing the first chip; biasing the data set representing the kerf or a second chip distinct from the first chip, in the case that the wafer control structure is in the data set representing the kerf or the second chip; simulating formation of the wafer control structure; determining whether the simulated wafer control structure complies with a target control structure; and iteratively adjusting an exposure dose condition in the case that the simulated wafer control structure does not comply with the target control structure.

A first aspect includes a computer-implemented method of accounting for photomask deviations in a lithographic process during optical proximity correction verification is disclosed, the method comprising: identifying a wafer control structure in a data set representing one of a first chip or a kerf; biasing the data set representing the first chip in the case that the wafer control structure is in the data set representing the first chip; biasing the data set representing the kerf or a second chip distinct from the first chip, in the case that the wafer control structure is in the data set representing the kerf or the second chip; simulating formation of the wafer control structure; determining whether the simulated wafer control structure complies with a target control structure; and iteratively adjusting an exposure dose condition in the case that the simulated wafer control structure does not comply with the target control structure.

A second aspect includes a computer system comprising: at least one computing device configured to account for photomask deviations in a lithographic process during optical proximity correction verification by performing actions comprising: identifying a wafer control structure in a data set representing one of a first chip or a kerf; biasing the data set representing the first chip in the case that the wafer control structure is in the data set representing the first chip; biasing the data set representing the kerf or a second chip distinct from the first chip, in the case that the wafer control structure is in the data set representing the kerf or the second chip; simulating formation of the wafer control structure; determining whether the simulated wafer control structure complies with a target control structure; and iteratively adjusting an exposure dose condition in the case that the simulated wafer control structure does not comply with the target control structure.

A third aspect includes a computer program comprising program code embodied in at least one computer-readable storage medium, which when executed, enables a computer system to account for photomask deviations in a lithographic process during optical proximity correction verification, the method comprising: identifying a wafer control structure in a data set representing one of a first chip or a kerf; biasing the data set representing the first chip in the case that the wafer control structure is in the data set representing the first chip; biasing the data set representing the kerf or a second chip distinct from the first chip, in the case that the wafer control structure is in the data set representing the kerf or the second chip; simulating formation of the wafer control structure; determining whether the simulated wafer control structure complies with a target control structure; and iteratively adjusting an exposure dose condition in the case that the simulated wafer control structure does not comply with the target control structure.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The subject matter disclosed herein relates to accounting for deviations in masks (photomasks) used in the fabrication of integrated circuits. More specifically, the subject matter disclosed herein relates to solutions for identifying deviations in photomasks and including the effects of these deviations in optical proximity correction verification (OPCV) simulations.

In the case that an integrated circuit process mask (e.g., a photomask) is not printed at its target critical dimension (CD), or the structure used for controlling the wafer lithography line is not at its target dimension on the mask, the lithography process may compensate for these errors by adjusting the exposure dose used. However, where the effect of changing dose is not equivalent to the change in mask critical dimensions for all structures, optical proximity correction verification (OPCV) may be inaccurate. For example, if a control structure is 2 nanometers larger than target on a mask, and the dose is reduced in order to make the control structure print at its target, then other structures may be printed at altered dimensions (e.g., either larger or smaller), depending upon the mask error enhancement factors (MEEF) and the exposure latitude of those structures.

Prior approaches assume that changing the exposure dose in-line will compensate exactly for changes in the mask critical dimension. However, when this assumption is invalid, OPCV may not account for these errors that could cause yield and reliability issues in the underlying printed circuit.

Figure 1:
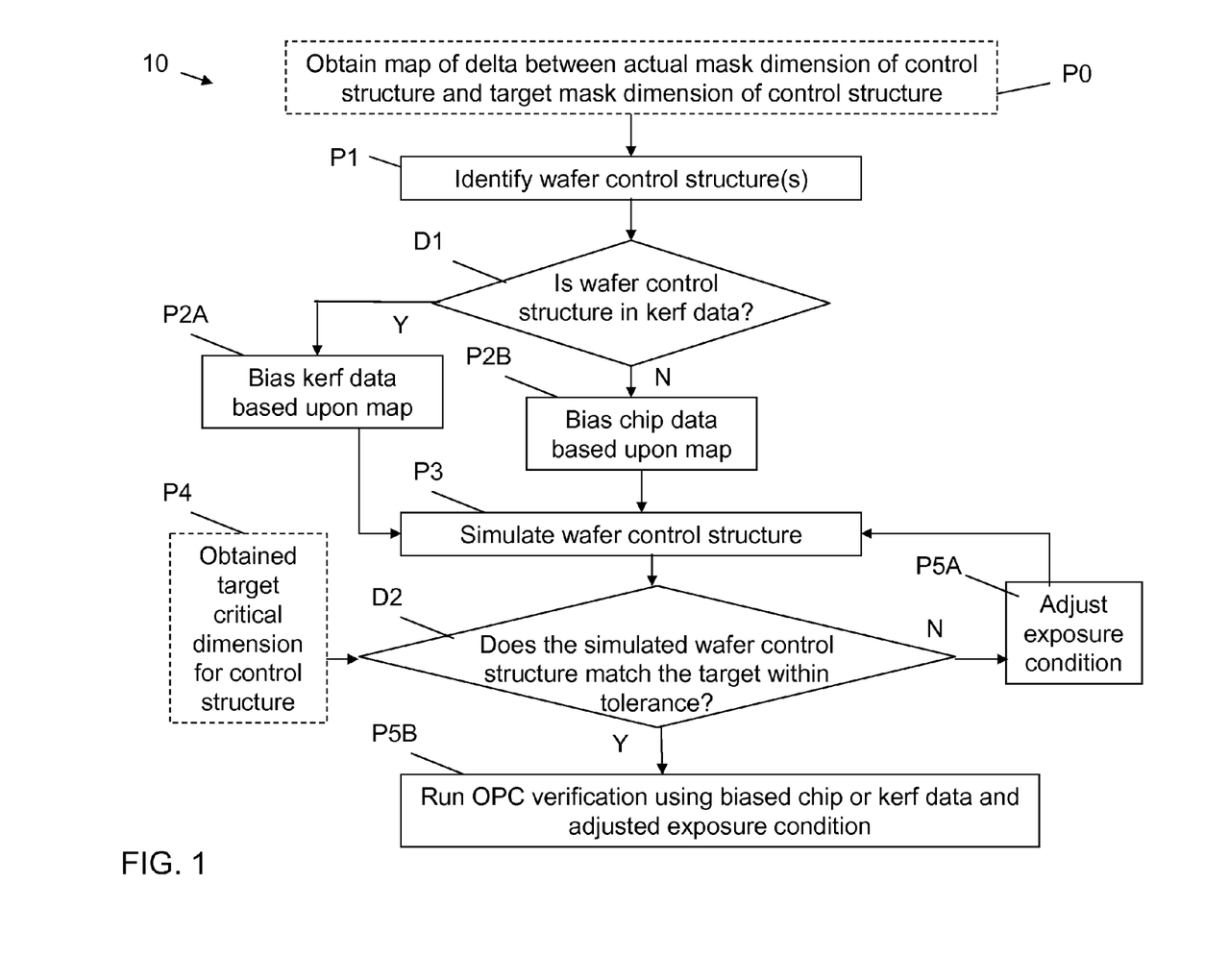
FIG. 1 shows a flow diagram depicting a method according to embodiments.

Turning to FIG. 1, a flow chart 10 illustrating processes according to embodiments is shown. In process P0 (shown in phantom as a possible pre-process), a map (e.g., a data map) of the differences between the actual dimensions of one or more mask control structure(s) and target dimensions of the one or more mask control structure(s) is obtained. It should be understood that this map (or, delta map) is generally intended to depict whether the mask is at its intended dimensions. In some embodiments, this process may include comparing data representing physical dimensions of the mask control structure with data representing physical dimensions of a target mask control structure. In other embodiments, the delta map may be obtained from another entity (e.g., a third party, data storage, etc.) as a pre-process. As is understood in the art, mask control structures (which are distinct from line control structures) define whether the photomask includes the correct dimensions (e.g., length and width of openings) and uniformity to allow for printing of the desired underlying structures on a wafer.

In any case, after obtaining the delta map, in process P1, wafer control structures (which may be distinct from or the same as the mask control structures) are identified. These wafer control structures may be those structures included in e.g., chip or kerf layout data that define physical dimensions of a feature as printed on a wafer. It is understood that a wafer may include a plurality of chips (such as in a multi-part wafer, MPW, which is described further herein), and kerfs (separation regions) between the chips on the wafer. In any case, process P1 includes identifying the wafer control structure(s) in the layout data (e.g., chip or kerf layout data). It is understood that in some embodiments, the kerf data and chip data may be included in the same data set, however, in other embodiments, the kerf data may be in a separate data set from the chip data (and further, individual chip data may be separated as well).

In decision D1, it is determined whether the wafer control structure is in the kerf layout data. In the case that the wafer control structure is in the kerf layout data (Yes to decision D1), then in process P2A, biasing of the kerf data occurs. That is, in the case that the kerf layout data includes the control structure, the mask delta map (obtained in process P0) is used to bias the kerf layout data accordingly. This generates biased kerf layout data which accounts for the deviation in the mask control structure. In the case that the wafer control structure is not in the kerf layout data (No to decision D1), then in process P2B, biasing of the chip data occurs. This is because the chip layout data includes the control structure when the kerf layout data does not. In the case that the chip layout data includes the control structure, the mask delta map (obtained in process P0) is used to bias that chip layout data accordingly. This generates biased chip layout data which accounts for the deviation in the mask control structure.

In process P3, following biasing of either the kerf data or the chip data, formation of the control structure is simulated according to known simulation methods. It is understood that the simulation is performed using the biased kerf or biased chip data, and as such, is able to account for mask control structure deviations more accurately than in conventional methods.

After simulation in process P3, in decision D2, it is determined whether the simulated control structure matches the target control structure, within a predetermined amount of tolerance. This may include comparing the critical dimensions of the simulated control structure to the target critical dimensions of the control structure. The target critical dimensions for the control structure may be obtained, e.g., from a third party, data storage, etc. in process P4 (shown in phantom as a possible pre-process).

In the case that the simulated control structure does not have critical dimensions within the tolerance for the target control structure (No, to decision D2), in process P5A, an exposure condition (e.g., dose, focus, etc.) provided in the simulation (process P3) is adjusted to correct for the difference. After adjusting the exposure condition, process P3 (simulation of control structure) may be repeated. It is understood that this iterative loop (decision D2, process P5A, process P3, decision D2, etc.) may be repeated until the simulated control structure is within the tolerance band of the target control structure.

In the case that the simulated control structure has critical dimensions within the tolerance for the target control structure (Yes, to decision D2), in process P5B, optical proximity correction verification (OPCV) is run according to conventional methods. However, unlike conventional methods of OPCV, process P5B may include running OPCV using the biased chip or biased kerf data, along with the adjusted dose exposure condition (in the case that the exposure dose condition has been adjusted at least once).

Figure 2:
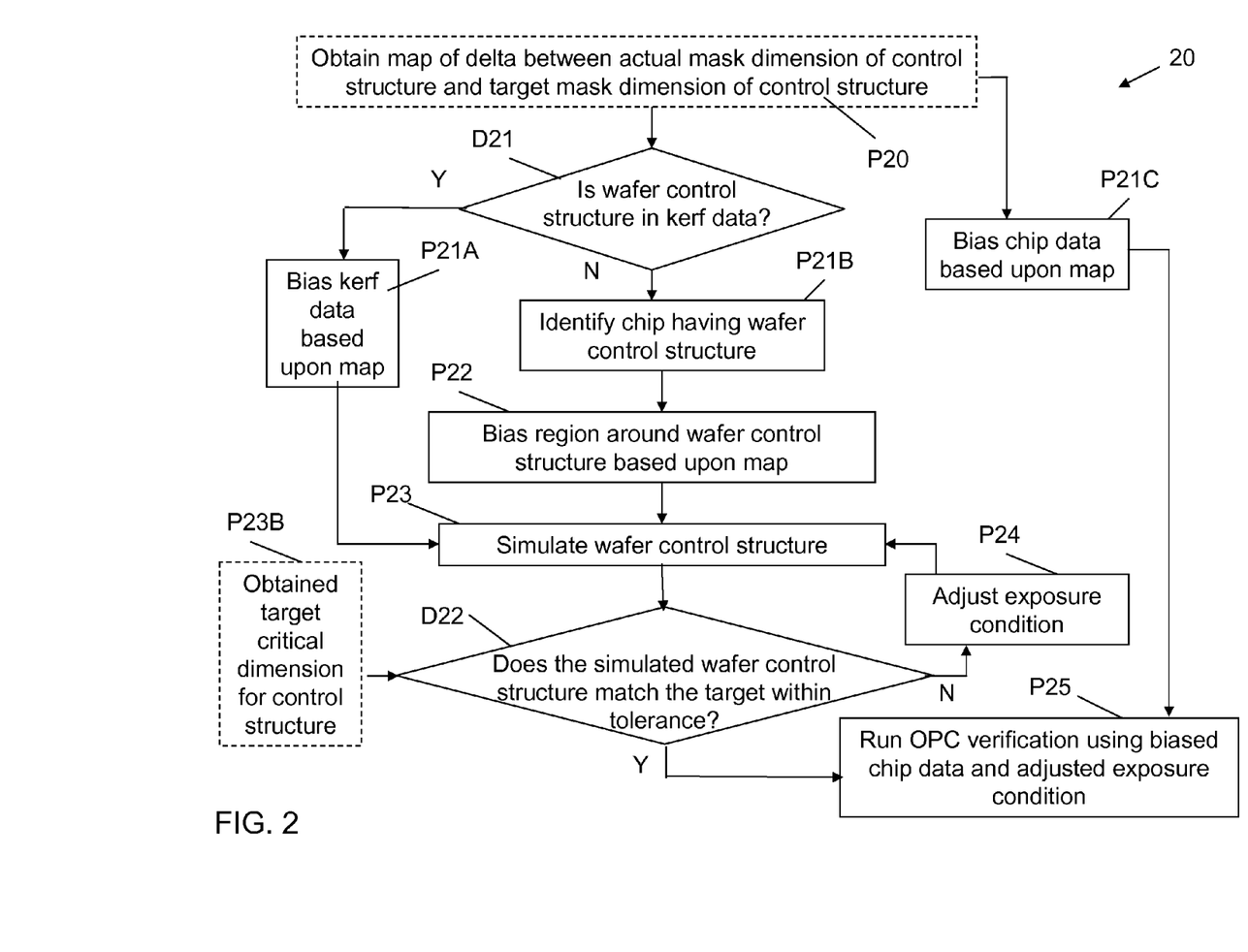
FIG. 2 shows a flow diagram depicting a method according to embodiments.

FIG. 2 shows a flow chart 20 illustrating processes according to other embodiments. Specifically, flow chart 20 may illustrate processes used in correcting deviations in masks (photomasks) for a multi-part wafer (MPW), which may include a plurality of integrated circuit chips.

In process P20 (shown in phantom as a possible pre-process), a map (e.g., a data map) of the differences between the actual dimensions of one or more mask control structure(s) and target dimensions of the one or more mask control structure(s) is obtained. It should be understood that this map (or, delta map) is generally intended to depict whether the mask is at its intended dimensions. In some embodiments, this process may include comparing data representing physical dimensions of the mask control structure with data representing physical dimensions of a target mask control structure. In other embodiments, the delta map may be obtained from another entity (e.g., a third party, data storage, etc.) as a pre-process. As is understood in the art, mask control structures (which are distinct from line control structures) define whether the photomask includes the correct dimensions (e.g., length and width of openings) and uniformity to allow for printing of the desired underlying structures on a wafer.

In any case, after obtaining the delta map, in decision D21, it is determined whether a wafer control structure (which may be distinct from or the same as the mask control structures) is in the kerf layout data. In the case that the wafer control structure is in the kerf layout data (Yes to decision D21), then in process P21A, biasing of the kerf data occurs. That is, in the case that the kerf layout data includes the control structure, the mask delta map (obtained in process P20) is used to bias the kerf layout data accordingly. This generates biased kerf layout data which accounts for the deviation in the mask control structure.

In the case that the wafer control structure is not in the kerf layout data (No to decision D21), then in process P21B, the particular chip, or chips (in a multi-part wafer) having the wafer control structure is identified. It is understood that in some embodiments, the wafer control structure might be located in one chip (e.g., chip "A"), where optical proximity correction verification (OPCV) is being performed for a second, distinct chip (e.g., chip "B"). It is further understood that in some embodiments, the wafer control structure could also appear in more than one of the chiplets on the multi-part wafer.

Following identification of the wafer control structure (and the chip with which it is associated) in process P21B, the data representing a region around the wafer control structure is biased using the delta map. That is, data representing a region proximate to the wafer control structure may be identified, and that data may then be biased using the delta map representing differences between the mask control structure and the target mask control structure (obtained in process P20). This generates biased chip layout data which accounts for the deviation in the mask control structure at the wafer level.

Simultaneously, or at a different time as processes P21A and/or P21B, process P21C may be performed, which may include biasing of the chip data based upon the delta map. This may be performed regardless of whether the control structure is in the kerf data or not (decision D21). In this case, the mask delta map (obtained in process P20) is used to bias that chip layout data according to the deviations in mask control structure. This generates biased chip layout data which accounts for the deviation in the mask control structure, and may be later used to run OPCV on the multi-part wafer (process P25).

In process P23, following biasing of the kerf data or the chip data (including the region around the wafer control structure), formation of the wafer control structure is simulated according to known simulation methods. It is understood that the simulation is performed using the biased kerf or biased chip data, and as such, is able to account for mask control structure deviations more accurately than in conventional methods.

After simulation in process P23, in decision D22, it is determined whether the simulated wafer control structure matches the target control structure, within a predetermined amount of tolerance. This may include comparing the critical dimensions of the simulated control structure to the target critical dimensions of the control structure. The target critical dimensions for the control structure may be obtained, e.g., from a third party, data storage, etc. in process P23B (shown in phantom as a possible pre-process).

In the case that the simulated control structure does not have critical dimensions within the tolerance for the target control structure (No, to decision D22), in process P24, an exposure condition (e.g., dose, focus, etc.) provided in the simulation (process P23) is adjusted to correct for the difference. After adjusting the exposure condition, process P23 (simulation of control structure) may be repeated. It is understood that this iterative loop (decision D22, process P24, process P23, decision D22, etc.) may be repeated until the simulated control structure is within the tolerance band of the target control structure.

In the case that the simulated control structure has critical dimensions within the tolerance for the target control structure (Yes, to decision D22), in process P25, optical proximity correction verification (OPCV) is run for a portion of the multi-part wafer (MPW) using the biased chip data and the adjusted exposure condition. Using the biased chip data and the adjusted dose may allow the OPCV process to accurately identify errors in the photomask across multiple chips and/or kerf regions in the MPW.

Figure 3:
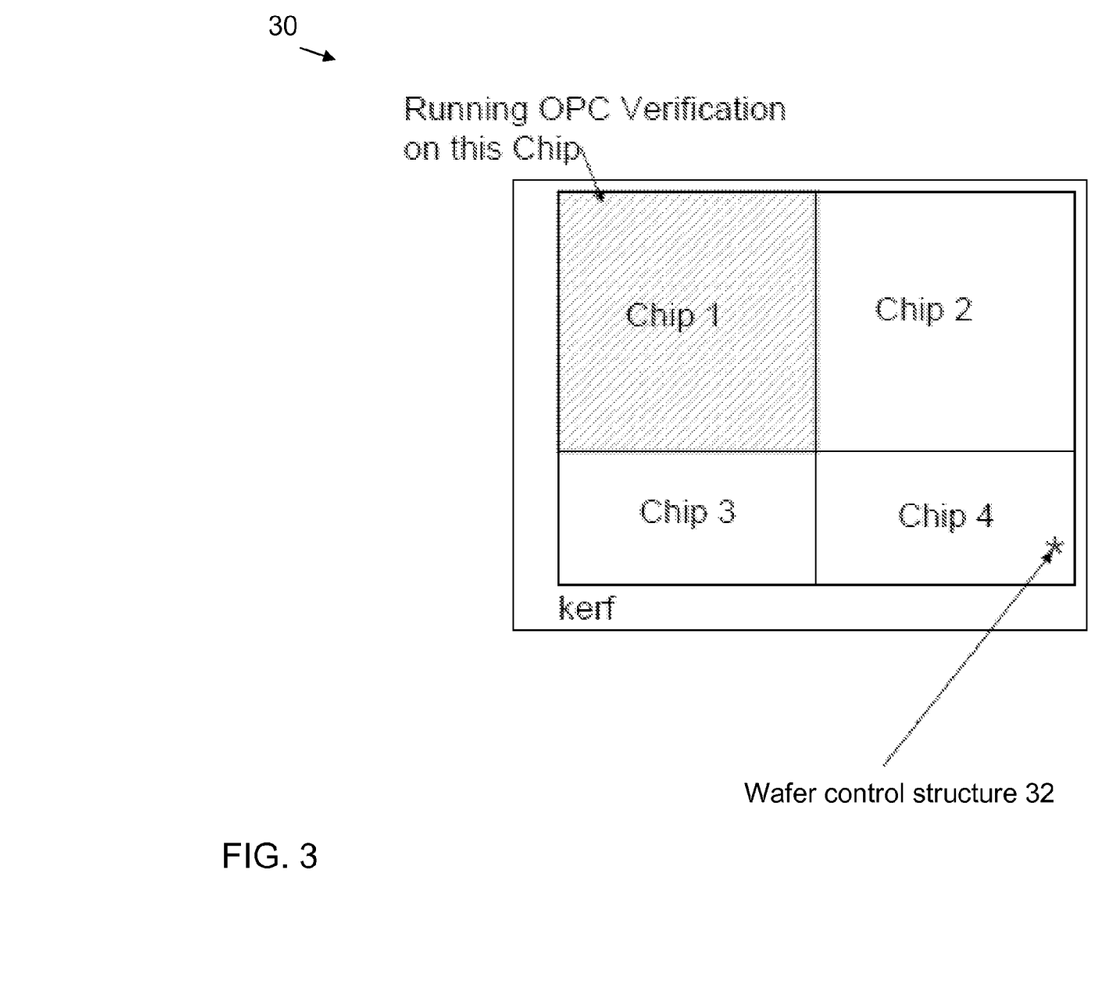
FIG. 3 shows an illustrative example of a multi-part wafer according to embodiments.

FIG. 3 shows an illustrative example of a multi-part wafer 30 shown according to embodiments. As shown, multi-part wafer (MPW) 30 may include four chips (Chip 1, Chip 2, Chip 3 and Chip 4) on the same kerf. Also shown in FIG. 3 is a wafer control structure 32, which in this example MPW 30, is contained in Chip 4. In the example shown in FIG. 3, OPC verification is being performed on Chip 1, while the wafer control structure 32 is contained in Chip 4. As will be described further herein, the data provided to OPC verification process may be biased based upon the wafer control structure 32.

Figure 4:
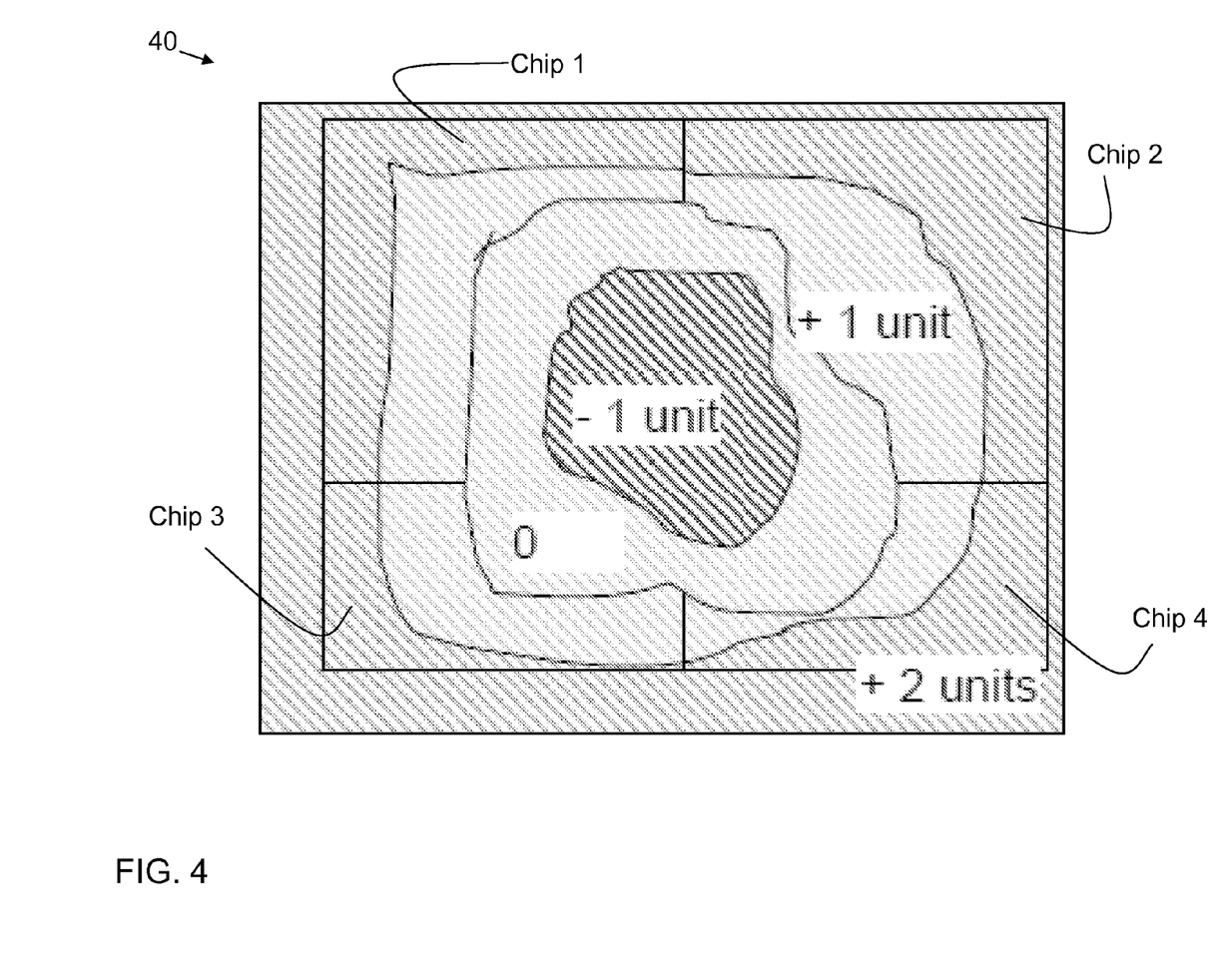
FIG. 4 shows a mask data map of the multi-part wafer of FIG. 3.

Turning to FIG. 4, a mask data map 40 (or, delta map) of the multi-part wafer 30 of FIG. 3 is shown. As shown, mask data map 40 may show general deviation quantities determined after comparing mask layout dimensions of the multi-part wafer 30 with a target mask control structure. For the purposes of example only, as shown, deviations range from negative one (−1) up to plus two (+2) units across portions of the MPW (30, FIG. 3). As shown, in this particular case, each chip includes at least a portion having each of the respective deviations. As indicated in the example of FIG. 3, Chip 4 includes the wafer control structure 32, and wafer control structure 32 is located in an area of +2 unit deviation (FIG. 5).

Figure 5:
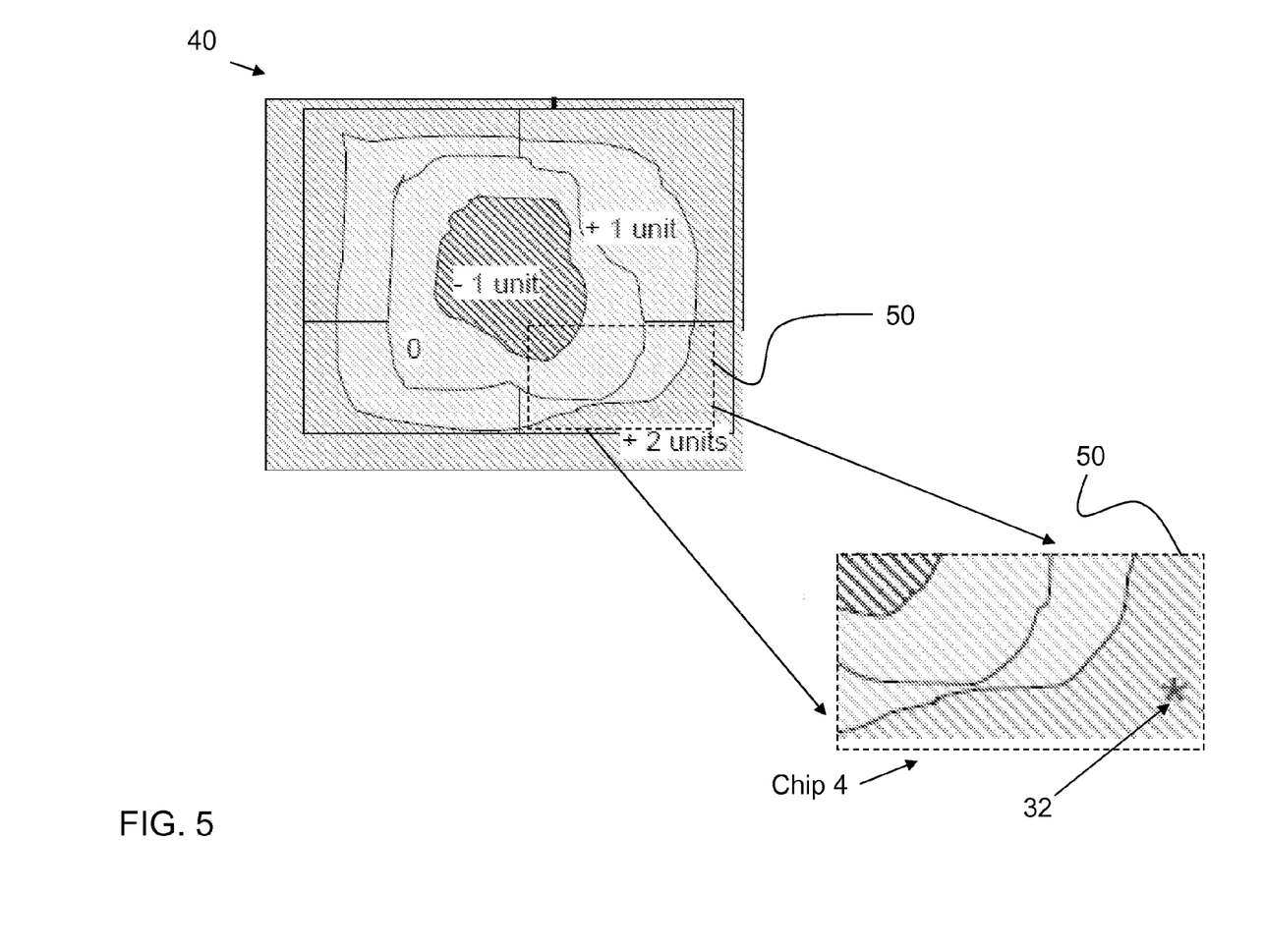
FIG. 5 shows the mask data map of FIG. 4, further including a close-up view of portions.

FIG. 5 shows the mask data map 40 of FIG. 4, further including a close-up view 50 of a portion of Chip 4. As shown, Chip 4 includes wafer control structure 32, which is included in the +2 unit deviation area. In order to compensate for this deviation (delta), and according to embodiments herein, the area around the wafer control structure 32 is biased (e.g., biased by physical dimension) based upon the deviation amount (process P22 in FIG. 2; also see processes P2A and P2B of FIG. 1). In the example shown in FIG. 5, embodiments allow for biasing of the mask data around control structure 32 by 2 units (in order to compensate for the +2 unit deviation). After biasing of the mask data around wafer control structure 32, the wafer control structure 32 may be simulated using the biased data (process P23, FIG. 2; also see process P3, FIG. 1).

Figure 6:
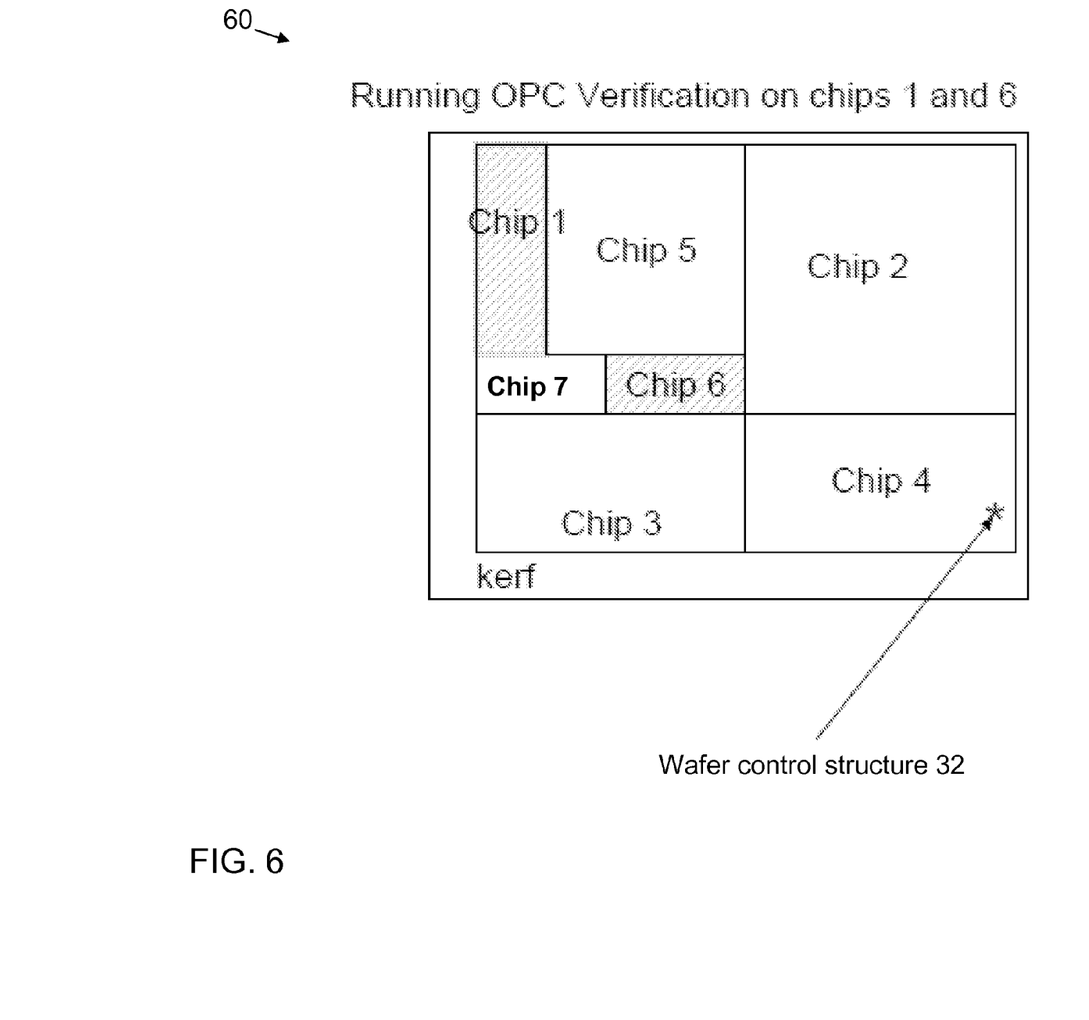
FIG. 6 shows an illustrative example of a multi-part wafer according to embodiments.

Turning to FIG. 6, another multi-part wafer (MPW) 60 is shown according to embodiments. In this example, MPW 60 includes six chips: Chip 1, Chip 2, Chip 3, Chip 4, Chip 5, Chip 6, and Chip 7 on the same kerf. In one example, according to embodiments, OPC verification may be run on chip 1 and chip 6. As shown, wafer control structure 32 is located in Chip 4.

Figure 7:
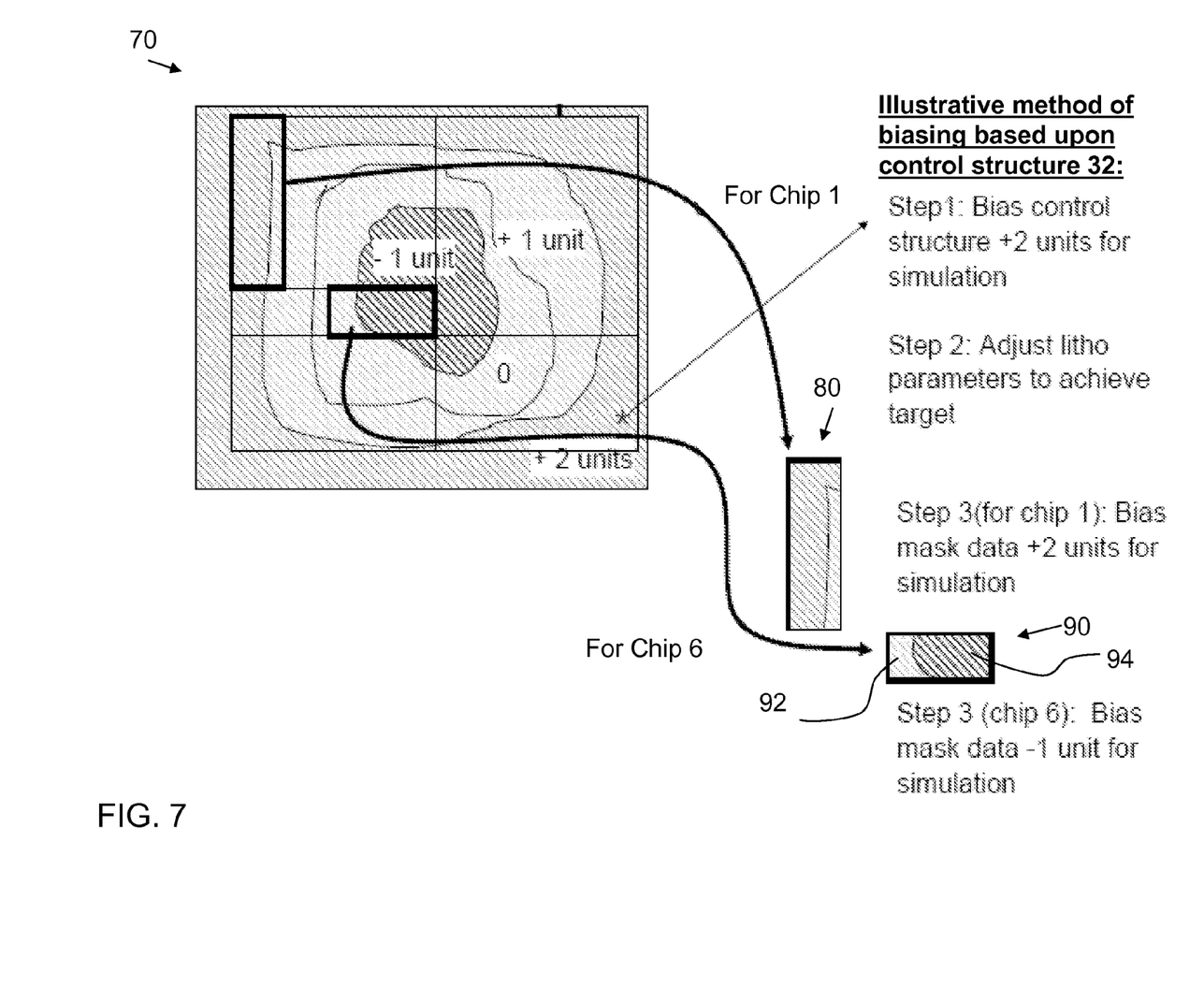
FIG. 7 shows a mask data map of the multi-part wafer of FIG. 6.

FIG. 7 shows a mask data map 70 for the MPW 60 of FIG. 6. As shown, mask data map 70 may show general deviation quantities determined after comparing mask layout dimensions of the multi-part wafer 60 with a target mask control structure. As shown, deviations range from negative one (−1) up to plus two (+2) units across portions of the MPW (70, FIG. 6). Also shown in FIG. 7 are a close-up view 80 of Chip 1, and a close-up view 90 of Chip 6. In one embodiment, a method may include the following processes: a) Bias the control structure 32 by its appropriate deviation. In this case, control structure 32 is in a +2 unit deviation region, and should be biased by 2 units; b) Adjust lithography parameters to get control structure 32 to print to its target (e.g., eliminate deviation by lithography adjustment); c) Examine the deviation for Chip 1, bias the mask data corresponding to Chip 1 according to its average or predominant deviation (in this case, +2 units), and simulate lithography of Chip 1 with the biased mask data; and d) Examine the deviation for Chip 6, bias the mask data corresponding to Chip 6 according to its average or predominant deviation (in this case, −1 units), and simulate lithography of Chip 6 with the biased mask data. It is further understood that regions within chips may be biased according to the methods described herein. In this case, an individual chip may include distinct regions with distinct biases, for example, in Chip 6, two distinct regions 92 (with zero bias) and 90 (with −1 unit bias) may be distinctly biased.

Figure 8:
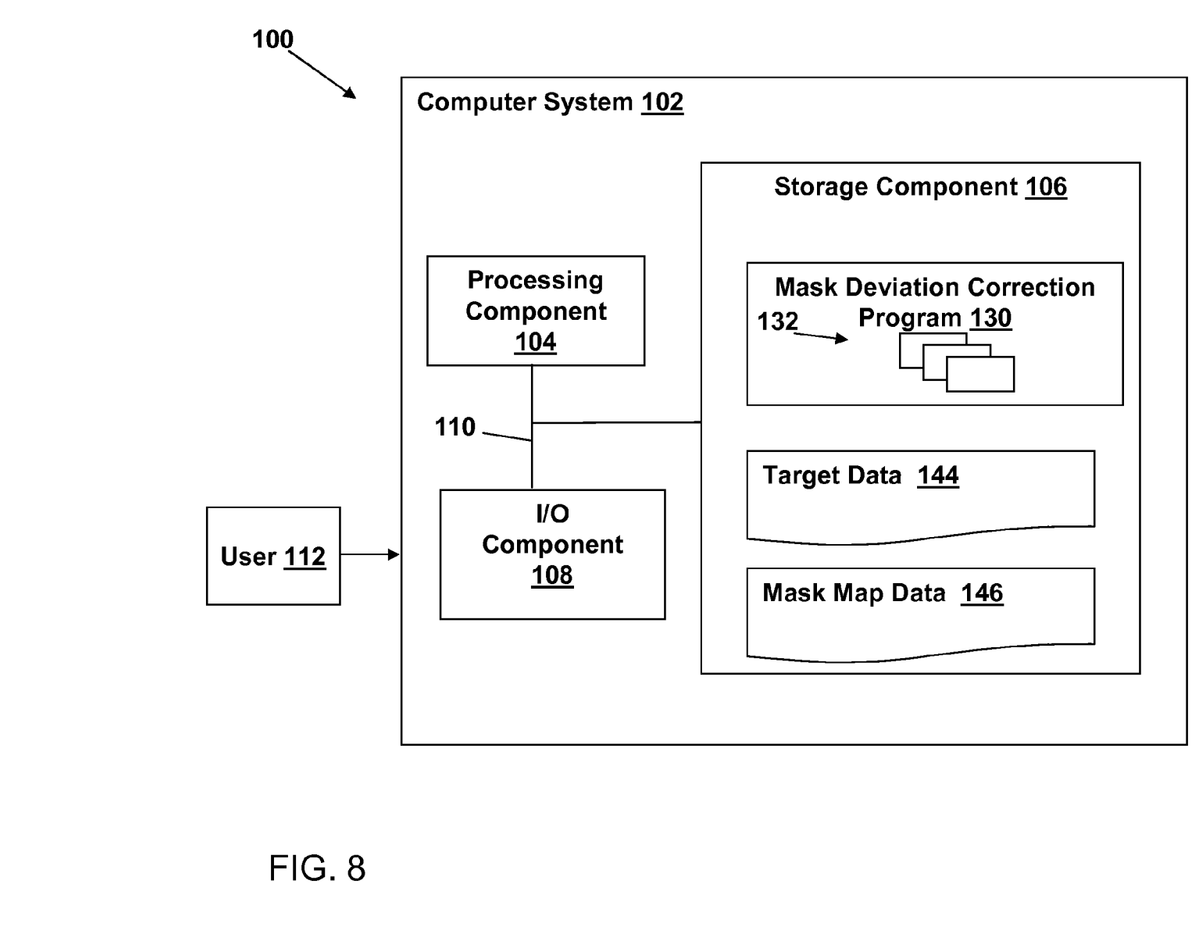

FIG. 8 depicts an illustrative environment 100 for correcting a mask deviation according to an embodiment. To this extent, the environment 100 includes a computer system 102 that can perform a process described herein in order to generate a cut mask in an integrated circuit design. In particular, the computer system 102 is shown as including a mask deviation correction program 130, which makes computer system 102 operable to handle correcting a mask deviation by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the mask deviation correction program 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the mask deviation correction program 130 can manage a set of interfaces (e.g., graphical user interface(s), application program interface, etc.) that enable human and/or system users 112 to interact with the mask deviation correction program 130. Further, the mask deviation correction program 130 can manage (e.g., store, retrieve, create, manipulate, organize, present, etc.) data, such as target data 144 and/or mask map data 146, etc., using any solution.

In any event, the computer system 102 can comprise one or more general purpose computing articles of manufacture (e.g., computing devices) capable of executing program code, such as the mask deviation correction program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the mask deviation correction program 130 can be embodied as any combination of system software and/or application software.

Further, the mask deviation correction program 130 can be implemented using a set of modules 132. In this case, a module 132 can enable the computer system 102 to perform a set of tasks used by the mask deviation correction program 130, and can be separately developed and/or implemented apart from other portions of the mask deviation correction program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of mask deviation correction program 130 fixed thereon (e.g., one or more modules 132). However, it is understood that the computer system 102 and mask deviation correction program 130 are only representative of various possible equivalent computer systems that may perform a process described herein. To this extent, in other embodiments, the functionality provided by the computer system 102 and mask deviation correction program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as target data (e.g., target critical dimension data, target control structure data, etc.) 144 and/or mask map data (e.g., delta map data, mask control structure data) 146 using any solution. For example, the computer system 102 can generate and/or be used to generate target data 144 and/or mask map data 146, retrieve target data 144 and/or mask map data 146, from one or more data stores, receive target data 144 and/or mask map data 146, from another system, send target data 144 and/or mask map data 146 to another system, etc.

While shown and described herein as a method and system for correcting a mask deviation, it is understood that aspects of the invention further provide various alternative embodiments. For example, in one embodiment, the invention provides a computer program fixed in at least one computer-readable medium, which when executed, enables a computer system to determine a lithographic set point. To this extent, the computer-readable medium includes program code, such as the mask deviation correction program 130 (FIG. 8), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the mask deviation correction program 130 (FIG. 8), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for correcting a mask deviation. In this case, a computer system, such as the computer system 102 (FIG. 8), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of accounting for photomask deviations in a lithographic process during optical proximity correction verification, the method comprising:
   identifying a wafer control structure in a data set representing one of a first chip or a kerf;
   biasing the data set representing the first chip if the wafer control structure is in the data set representing the first chip;
   biasing the data set representing the kerf or a second chip distinct from the first chip, if the wafer control structure is in the data set representing the kerf or the second chip;
   simulating formation of the wafer control structure;
   determining whether the simulated wafer control structure complies with a target control structure; and
   iteratively adjusting an exposure dose condition if the simulated wafer control structure does not comply with the target control structure.

2. The computer-implemented method of claim 1, further comprising running the optical proximity correction verification on the simulated wafer control structure using the adjusted exposure dose condition and one of the biased data set representing the first chip and the biased data set representing the kerf or the second chip.

3. The computer-implemented method of claim 1, wherein the simulated wafer control structure complies with the target control structure if the simulated wafer control structure is within a predetermined tolerance band of the target control structure.

4. The computer-implemented method of claim 1, further comprising:
   measuring a mask control structure prior to the identifying a wafer control structure; and
   creating a map of differences between the mask control structure and a target mask control structure after the measuring of the mask control structure.

5. The computer-implemented method of claim 4, wherein the biasing the data set representing the kerf or the second chip is performed using the map of the differences between the mask control structure and the target mask control structure.

6. The computer-implemented method of claim 4, wherein the biasing the data set representing the first chip or biasing a data set representing a subset of the first chip, is performed using the map of the differences between the mask control structure and the target mask control structure.

7. The computer-implemented method of claim 4, further comprising biasing a region around the wafer control structure based upon the map of the differences between the mask control structure and the target mask control structure.

8. The computer-implemented method of claim 1, further comprising running the optical proximity correction verification on the simulated wafer control structure using the adjusted exposure dose condition and one of the biased data set representing the first chip and the biased data set representing the kerf or the second chip.

9. The computer-implemented method of claim 1, wherein the simulated wafer control structure complies with the target control structure if the simulated wafer control structure is within a predetermined tolerance band of the target control structure.

10. The computer-implemented method of claim 1, further comprising:
    measuring a mask control structure prior to the identifying a wafer control structure; and
    creating a map of differences between the mask control structure and a target mask control structure after the measuring a mask control structure.

11. The computer-implemented method of claim 10, wherein the biasing the data set representing the kerf or the second chip is performed using the map of the differences between the mask control structure and the target mask control structure; and the biasing the data set representing the first chip is performed using the map of the differences between the mask control structure and the target mask control structure.

12. The computer-implemented method of claim 10, further comprising biasing a region around the wafer control structure based upon the map of the differences between the mask control structure and the target mask control structure.

13. A computer system comprising:
at least one computing device configured to account for photomask deviations in a lithographic process during optical proximity correction verification by performing actions comprising:
identifying a wafer control structure in a data set representing one of a first chip or a kerf;
biasing the data set representing the first chip if the wafer control structure is in the data set representing the first chip;
biasing the data set representing the kerf or a second chip distinct from the first chip, if the wafer control structure is in the data set representing the kerf or the second chip;
simulating formation of the wafer control structure;
determining whether the simulated wafer control structure complies with a target control structure; and
iteratively adjusting an exposure dose condition if the simulated wafer control structure does not comply with the target control structure.

14. The computer system of claim 13, further comprising running the optical proximity correction verification on the simulated wafer control structure using the adjusted exposure dose condition and one of the biased data set representing the first chip and the biased data set representing the kerf or the second chip.

15. The computer system of claim 13, wherein the simulated wafer control structure complies with the target control structure if the simulated wafer control structure is within a predetermined tolerance band of the target control structure.

16. The computer system of claim 13, further comprising:
measuring a mask control structure prior to the identifying of a wafer control structure; and
creating a map of differences between the mask control structure and a target mask control structure after the measuring of a mask control structure.

17. The computer system of claim 16, wherein the biasing the data set representing the kerf or the second chip is performed using the map of the differences between the mask control structure and the target mask control structure.

18. The computer system of claim 16, wherein the biasing the data set representing the first chip or biasing a data set representing a subset of the first chip is performed using the map of the differences between the mask control structure and the target mask control.

19. The computer system of claim 16, further comprising biasing a region around the wafer control structure based upon the map of the differences between the mask control structure and the target mask control structure.

20. A computer program comprising program code embodied in at least one non-transitory computer-readable medium, which when executed, enables a computer system to account for photomask deviations in a lithographic process during optical proximity correction verification, the method comprising:
identifying a wafer control structure in a data set representing one of a first chip or a kerf;
biasing the data set representing the first chip if the wafer control structure is in the data set representing the first chip;
biasing the data set representing the kerf or a second chip distinct from the first chip, if the wafer control structure is in the data set representing the kerf or the second chip;
simulating formation of the wafer control structure;
determining whether the simulated wafer control structure complies with a target control structure; and
iteratively adjusting an exposure dose condition if the simulated wafer control structure does not comply with the target control structure.

* * * * *